(12) United States Patent
Yoshizawa et al.

(10) Patent No.: US 8,149,033 B2
(45) Date of Patent: Apr. 3, 2012

(54) PHASE CONTROL DEVICE, PHASE-CONTROL PRINTED BOARD, AND CONTROL METHOD

(75) Inventors: Yoshiharu Yoshizawa, Kawasaki (JP); Yoshito Koyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/899,063

(22) Filed: Oct. 6, 2010

(65) Prior Publication Data
US 2011/0018601 A1 Jan. 27, 2011

Related U.S. Application Data

(63) Continuation of application No. PCT/JP2008/067544, filed on Sep. 26, 2008.

(30) Foreign Application Priority Data

Apr. 11, 2008 (JP) ................................. 2008-104050

(51) Int. Cl.
*H03L 7/06* (2006.01)
(52) U.S. Cl. ........................................ 327/158; 327/149
(58) Field of Classification Search .................. 327/149, 327/158
See application file for complete search history.

(56) References Cited

U.S. PATENT DOCUMENTS

| | | | |
|---|---|---|---|
| 6,118,730 A | 9/2000 | Kubo et al. | |
| 2004/0017873 A1* | 1/2004 | Chong et al. | 375/376 |
| 2004/0145396 A1* | 7/2004 | Yee et al. | 327/156 |
| 2004/0155696 A1* | 8/2004 | Gauthier et al. | 327/530 |
| 2004/0156396 A1* | 8/2004 | Amick et al. | 370/503 |
| 2004/0183578 A1* | 9/2004 | Chong et al. | 327/161 |
| 2005/0110548 A1 | 5/2005 | Suda et al. | |
| 2005/0140416 A1* | 6/2005 | Rashid | 327/277 |
| 2005/0168255 A1* | 8/2005 | Gauthier et al. | 327/161 |
| 2006/0170472 A1* | 8/2006 | Suda et al. | 327/158 |
| 2006/0193419 A1* | 8/2006 | Maneatis et al. | 375/376 |
| 2006/0273836 A1* | 12/2006 | Lin | 327/158 |
| 2007/0040594 A1* | 2/2007 | Jung | 327/156 |
| 2007/0063749 A1* | 3/2007 | Fan | 327/158 |
| 2008/0054957 A1* | 3/2008 | Takeda et al. | 327/143 |
| 2008/0265970 A1* | 10/2008 | Vlasenko | 327/333 |
| 2009/0116306 A1* | 5/2009 | Song et al. | 365/189.09 |
| 2009/0146705 A1* | 6/2009 | Huang | 327/158 |
| 2010/0085094 A1* | 4/2010 | Ma | 327/158 |
| 2010/0117694 A1* | 5/2010 | Kim | 327/157 |
| 2010/0117709 A1* | 5/2010 | Vlasenko | 327/333 |

FOREIGN PATENT DOCUMENTS

JP 61-225905 A 10/1986
(Continued)

*Primary Examiner* — Lincoln Donovan
*Assistant Examiner* — Adam Houston
(74) *Attorney, Agent, or Firm* — Westerman, Hattori, Daniels & Adrian, LLP

(57) ABSTRACT

A DLL circuit includes a delay line that adds, when receiving a reference signal, a delay amount to the phase of the reference signal by using each delay element and outputs a delay signal for each delay element. The DLL circuit includes a phase detector that compares the phase of a delay signal delayed by all the delay elements and the phase of the reference signal to obtain a phase difference by using the delay signal adjusted by a phase adjustment circuit and the reference signal. The DLL circuit includes a delay element control circuit that inputs a value, by which the delay signal to be compared by the phase detector is synchronized with the reference signal to be compared by the phase detector and which is a control voltage value generated from the phase difference output from the phase detector, into the delay elements of the delay line.

16 Claims, 12 Drawing Sheets

FOREIGN PATENT DOCUMENTS

| | | |
|---|---|---|
| JP | 2-008950 A | 1/1990 |
| JP | 7-067333 A | 3/1995 |
| JP | 2000-134090 A | 5/2000 |
| JP | 2006-025131 A | 1/2006 |
| WO | 2005/050844 A1 | 6/2005 |

* cited by examiner

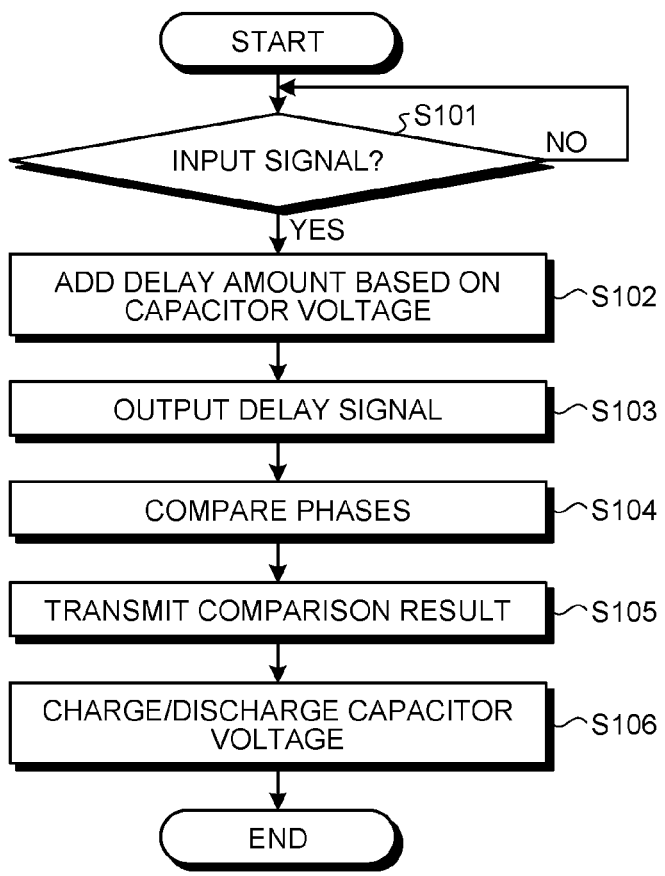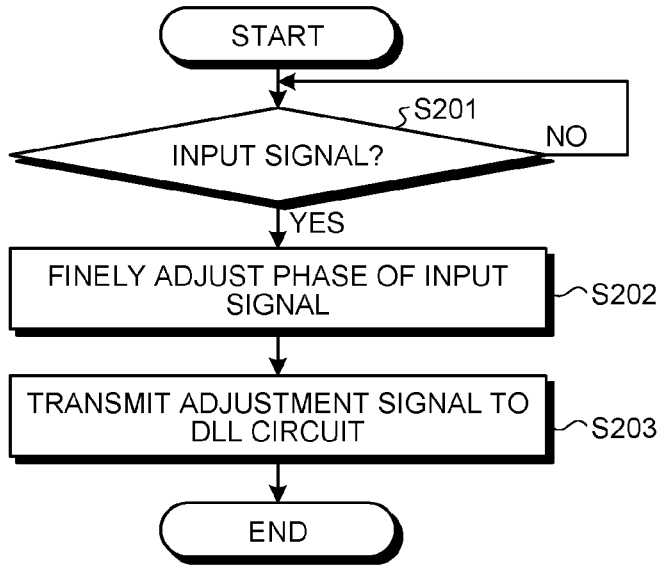

PHASE ADJUSTMENT CIRCUIT Delay

PHASE CONTROL DEVICE, PHASE-CONTROL PRINTED BOARD, AND CONTROL METHOD

CROSS-REFERENCE TO RELATED APPLICATION

This application is a continuation of International Application No. PCT/JP2008/067544, filed on Sep. 26, 2008, the entire contents of which are incorporated herein by reference.

FIELD

The embodiments discussed herein are directed to a phase control device, a phase-control printed board, and a control method.

BACKGROUND

There have been conventionally known various techniques for obtaining an output signal that is obtained by adjusting the phase of a signal. For example, there has been known DLL (Delay Locked Loop) as one technique for obtaining an output signal that is obtained by adjusting the phase of a signal. DLL includes, for example, a delay element that adds a delay amount to a phase. The DLL compares the phase of an input signal and a value that is obtained by adding the delay amount of the delay element to the phase of the input signal, and generates a delay signal of which the phase is delayed as an output signal.

In addition, there is disclosed a technique for providing an offset control circuit (resistance dividing circuit) to adjust the phase of an output signal as one technique for obtaining an output signal that is obtained by adjusting the phase of a signal.

Patent Document 1: Japanese Laid-open Patent Publication No. 61-225905
Patent Document 2: Japanese Laid-open Patent Publication No. 7-67333

However, there is a problem in that the above conventional technique cannot adjust the phase of an output signal in fine detail.

For example, in the conventional technique, each delay element adds a delay amount, which is not less than a predetermined minimum value and is not more than a predetermined maximum value, to the phase of an input signal. In this case, a predetermined minimum value is the propagation delay time of the delay element and indicates phase resolution between delay elements. For this reason, in the conventional technique, because a delay amount that is added to the phase of an input signal cannot be less than or equal to a predetermined minimum value, the phase of an output signal cannot be adjusted not more than a predetermined minimum value in fine detail. In addition, Patent Document 1 and Patent Document 2 do not disclose a technique for adjusting the phase of an output signal in fine detail.

SUMMARY

According to an aspect of an embodiment of the invention, a phase control device includes a DLL circuit that adds a delay amount to a phase of a reference signal by using delay elements. The DLL circuit includes a delay line that adds, when receiving the reference signal, a delay amount to the phase of the reference signal by using each of the delay elements and outputs a delay signal for each of the delay elements; a phase detector that compares a phase of a delay signal delayed by all the delay elements of the delay line and the phase of the reference signal to obtain a phase difference by using at lease one of the delay signal whose phase is adjusted by a phase adjustment circuit and the reference signal; and a delay element control circuit that inputs a control voltage value into each of the delay elements of the delay line, the control voltage value being a value by which the delay signal to be compared by the phase detector is synchronized with the reference signal to be compared by the phase detector and being generated from the phase difference output from the phase detector.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF THE DRAWINGS

FIG. 6 is a flowchart explaining an example of a process performed by a DLL circuit according to the first embodiment;
FIG. 7 is a flowchart explaining an example of a process performed by the PLL circuit according to the first embodiment.

DESCRIPTION OF EMBODIMENTS

Preferred embodiments of the present invention will be explained with reference to accompanying drawings. Hereinafter, the brief of the configuration of LSI, the configuration and process flow of LSI according to the first embodiment, and the effect of LSI according to the first embodiment are sequentially explained, and then the other embodiments are explained.

First Embodiment

Brief of LSI Configuration by First Embodiment

Figure 1:
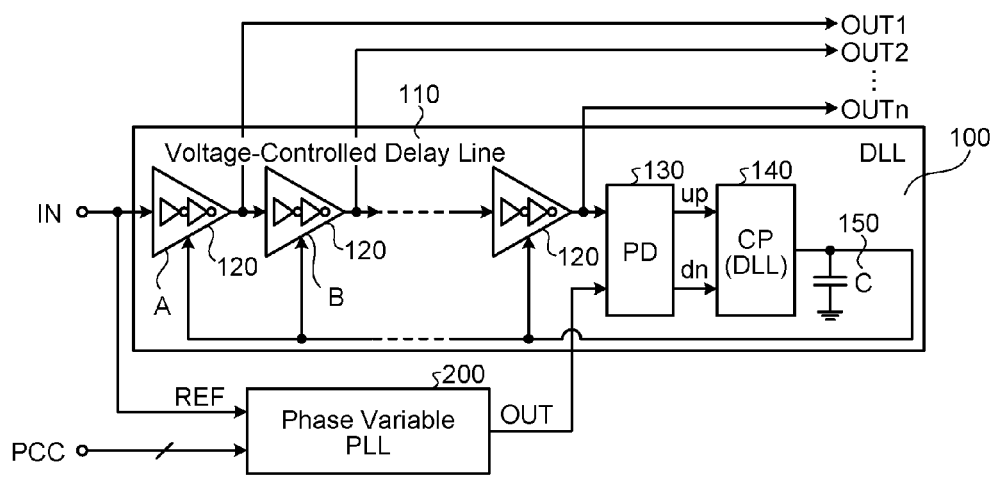
FIG. 1 is a diagram explaining a configuration example of LSI according to a first embodiment.

First, it will be simply explained about the brief of the configuration of LSI (also referred to as "phase control device") according to a first embodiment with reference to FIG. 1. Moreover, the brief of LSI according to the first embodiment is simply explained with reference to FIG. 1, and then the configuration of LSI according to the first embodiment is explained. FIG. 1 is a diagram explaining a configuration example of LSI according to the first embodiment.

As illustrated in FIG. 1, the LSI according to the first embodiment includes a DLL (Delay Locked Loop) circuit 100 and a PLL (phase-variable PLL (Phase locked loop)) circuit 200.

The DLL circuit 100 adds a delay amount (delay time) to the phase of an input signal (also referred to as "reference signal") by using each delay element 120 that is provided in the DLL circuit 100. Moreover, as illustrated by "OUT1" to "OUTn" of FIG. 1, the DLL circuit 100 outputs a delay signal that is an input signal to which a delay amount is added by each of the delay elements 120.

The PLL circuit 200 outputs an adjustment signal that is obtained by adjusting the phase of the input signal to the DLL circuit 100. Moreover, the PLL circuit 200 can adjust a phase finely than a predetermined minimum amount (propagation delay amount of the delay element 120) of the delay amount that is added by the delay element 120 provided inside the DLL circuit 100.

As described below, in the LSI according to the first embodiment, the same input signal is input into the DLL circuit 100 and the PLL circuit 200. In the LSI according to the first embodiment, an adjustment signal in addition to the input signal is transmitted to the DLL circuit 100 (a phase detector 130) to control a delay amount to be added to the input signal. As a result, the LSI according to the first embodiment makes it possible to finely control the phase of an output signal, which cannot be performed in the past.

LSI Configuration by First Embodiment

Next, it will be explained about the configuration of LSI according to the first embodiment with reference to FIGS. 1 and 2. First, among the configurations of LSI according to the first embodiment, it is mainly explained about a configuration example of the DLL circuit 100, and then it is explained about a configuration example of the PLL circuit 200 of the LSI according to the first embodiment.

DLL Circuit by First Embodiment

First, as illustrated in FIG. 1, the LSI according to the first embodiment includes the DLL circuit 100. Furthermore, the LSI according to the first embodiment includes a voltage-controlled delay line 110 and the phase detector ("PD") 130 in the DLL circuit 100. Furthermore, the LSI according to the first embodiment includes a charge pump (DLL) ("CP") 140 and a capacitor ("C") 150.

The capacitor 150 may be referred to as a "delay element control circuit".

The voltage-controlled delay line 110 includes the plurality of delay elements 120 (Tap) of which each adds a delay amount to the phase of a signal. For example, in an example illustrated in FIG. 1, the voltage-controlled delay line 110 includes the plurality of delay elements 120 that is serially coupled. Moreover, the voltage-controlled delay line 110 is connected to the phase detector 130. Moreover, each of the delay elements 120 included in the voltage-controlled delay line 110 is connected to the capacitor 150.

When receiving an input signal from the outside of the DLL circuit 100, the voltage-controlled delay line 110 adds a delay amount to the phase of the input signal by using each of the delay elements 120 and outputs a delay signal for each of the delay elements 120 to the outside of the DLL circuit 100. In this case, an input signal is, for example, a clock signal.

Specifically, the voltage-controlled delay line 110 receives an input signal from the outside of the DLL circuit 100 in which the voltage-controlled delay line 110 is provided. Then, in the voltage-controlled delay line 110, the input signal is input into one end of the plurality of delay elements 120 that is serially coupled, and each of the plurality of delay elements 120 adds a delay amount to the input signal. Then, the voltage-controlled delay line 110 outputs a delay signal for each of the delay elements 120 to the outside of the DLL circuit 100.

Moreover, the voltage-controlled delay line 110 outputs a delay signal delayed by all the delay elements 120 to the phase detector 130. Specifically, the voltage-controlled delay line 110 outputs a delay signal from the other end (an end different from one end into which the input signal is input, that is, a final-stage of the delay elements 120) of the plurality of delay elements 120 that is serially coupled to the phase detector 130.

In this case, it is further specifically explained about the case where a delay signal is output to the outside of the DLL circuit 100. In the voltage-controlled delay line 110, a delay signal, which is obtained by adding a delay amount by using a part or the whole of the plurality of delay elements 120 that is serially coupled, is output from between the delay element 120 and the delay element 120.

In the case of the explanation using a specific example, in the example illustrated in FIG. 1, the voltage-controlled delay line 110 outputs a delay signal, which is obtained by adding a delay amount by using the delay element "A", as "OUT1". Moreover, the voltage-controlled delay line 110 outputs a delay signal, which is obtained by adding a delay amount by using the delay element "A" and the delay element "B", as "OUT2". Moreover, the voltage-controlled delay line 110 outputs a delay signal, which is obtained by adding a delay amount by using all the delay elements, as "OUTn".

Furthermore, it is simply explained about the delay element 120. Each of the delay elements 120 are made, for example, by combining two inverters. Each of the delay elements 120 decides a delay amount to be added to the phase of an input signal in accordance with a control voltage to be input by the capacitor 150. Moreover, a delay amount is within a certain scope, and is an amount which is not less than a predetermined minimum amount and is not more than a predetermined maximum amount. In other words, the delay amount does not become an amount that is not more than the predetermined minimum amount.

A predetermined minimum amount of a delay amount that is added by each of the delay elements 120 becomes a propagation delay amount of the delay element 120 itself. In other words, a predetermined minimum amount is a delay amount that should be certainly delayed when the delay element 120 transmits a signal. The minimum time is shortened (the minimum amount is reduced) with further miniaturization of LSI when the device is realized by LSI as an example. However, a limit as phase resolution is an order of several dozen psec.

The phase detector 130 is connected to the voltage-controlled delay line 110, the charge pump (DLL) 140, and the PLL circuit 200. In this case, the phase detector 130 is connected to the voltage-controlled delay line 110 via the delay element 120 that is located at the final stage of the delay elements 120 included in the voltage-controlled delay line 110.

The phase detector 130 compares the phases of two signals. Specifically, the phase detector 130 receives a delay signal delayed by all the delay elements 120 of the voltage-controlled delay line 110 from the voltage-controlled delay line 110. Moreover, the phase detector 130 receives an adjustment signal from the PLL circuit 200. Then, the phase detector 130 compares the phase of the delay signal received from the voltage-controlled delay line 110 and the phase of the adjustment signal output from the PLL circuit 200. Then, the phase detector 130 transmits a comparison result (phase difference) to the charge pump (DLL) 140.

As a specific example, when the phase of the delay signal advances in comparison with the adjustment signal on the basis of a difference between the phases of two signals, the phase detector 130 transmits the phase difference to the charge pump (DLL) 140 as a down signal pulse. On the other hand, when the phase of the delay signal delays in comparison with the adjustment signal, the phase detector 130 transmits the phase difference to the charge pump (DLL) 140 as an up signal pulse.

The charge pump (DLL) 140 is connected to the phase detector 130 and the capacitor 150. Moreover, when the comparison result is transmitted from the phase detector 130, the charge pump (DLL) 140 supplies an electric current that corresponds to the comparison result to the capacitor 150.

Specifically, when the phase difference is transmitted from the phase detector 130, the charge pump (DLL) 140 converts the phase difference transmitted from the phase detector 130 into an electric current, and charges electric currents to the capacitor 150 or discharges electric currents from the capacitor 150. In this case, the charge pump (DLL) 140 charges electric currents to the capacitor 150 when the phase difference is transmitted from the phase detector 130 as an up signal pulse. Moreover, the charge pump (DLL) 140 discharges electric currents from the capacitor 150 when the phase difference is transmitted from the phase detector 130 as a down signal pulse.

The capacitor 150 is connected to the charge pump (DLL) 140 and the delay elements 120 of the voltage-controlled delay line 110. Moreover, the capacitor 150 inputs a control voltage, which is generated and controlled from the phase difference output from the phase detector 130, into the plurality of delay elements 120 of the voltage-controlled delay line 110.

Specifically, the capacitor 150 is charged or discharged by the charge pump (DLL) 140. In this case, in the capacitor 150, the electric currents charged or discharged by the charge pump (DLL) 140 are integrated by the capacity of the capacitor 150 to be a control voltage. The capacitor 150 inputs the control voltage into the delay elements 120 of the voltage-controlled delay line 110.

In the DLL circuit 100, a phase difference between a delay signal and an adjustment signal is always monitored by the phase detector 130, and a process is performed in such a manner that the phase difference of two signals is canceled. In this case, a state where the phase difference of two signals is canceled indicates a state where a delay signal is delayed by one period to be synchronized with an adjustment signal.

Specifically, in the DLL circuit 100, the comparison result is fed back from the phase detector 130 to the capacitor 150 via the charge pump (DLL) 140. As a result, the control voltage of the capacitor 150 becomes a value by which the delay signal to be compared by the phase detector 130 is synchronized with the adjustment signal, and thus the delay signal delayed by all the delay elements 120 becomes a signal of which the phase is synchronized with the adjustment signal.

PLL Circuit by First Embodiment

Figure 3:
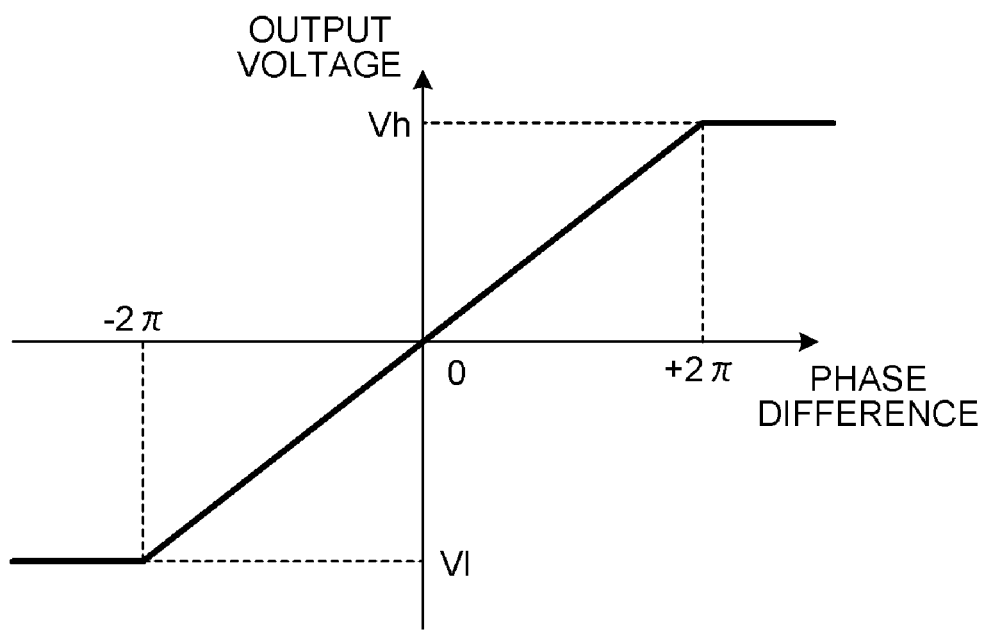
FIG. 3 is a diagram explaining a relationship between an output voltage output from a charge pump and a phase difference.
Figure 4:
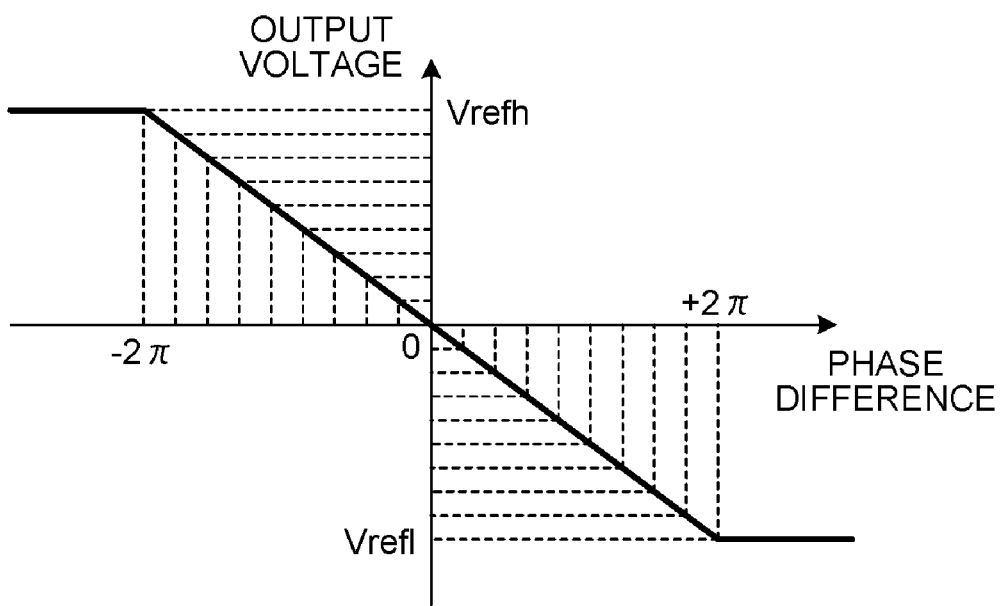
FIG. 4 is a diagram explaining a relationship between an output voltage output from a bias control unit and a phase difference.
Figure 5:
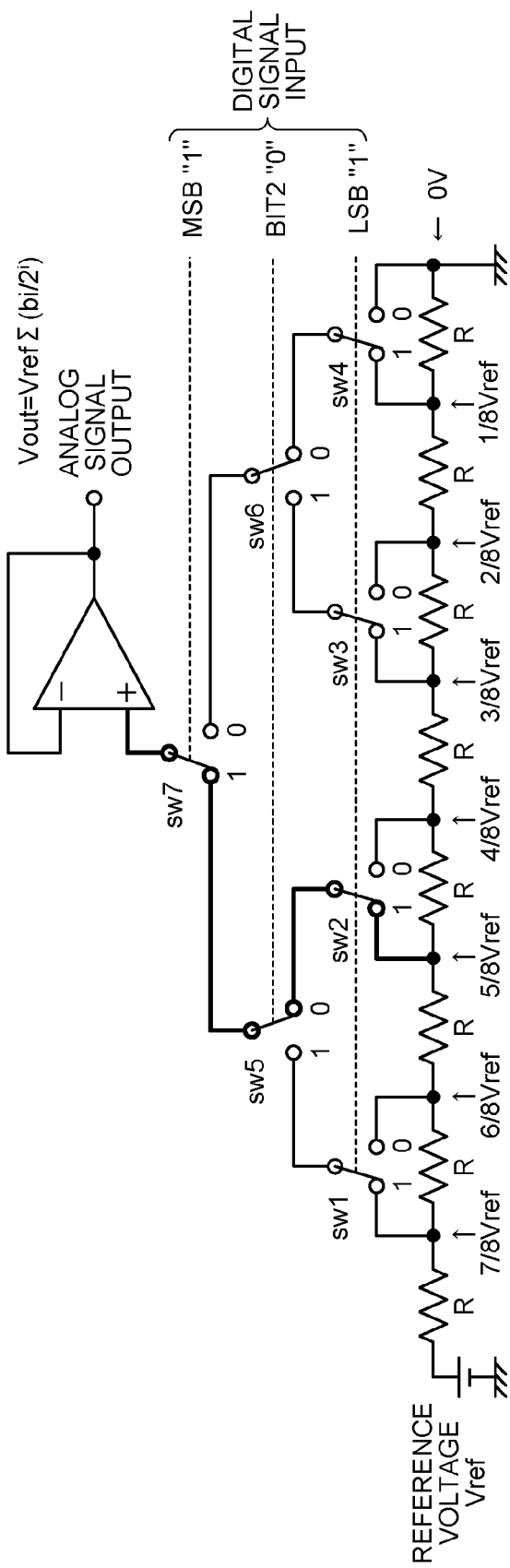
FIG. 5 is a diagram explaining a configuration example of the bias control unit when using a resistor string DAC.

Next, it will be explained about a configuration example of the PLL circuit according to the first embodiment with reference to FIGS. 2 to 5. FIG. 2 is a diagram explaining a configuration example of the PLL circuit according to the first embodiment. FIG. 3 is a diagram explaining a relationship between an output voltage output from a charge pump and a phase difference. FIG. 4 is a diagram explaining a relationship between an output voltage output from a bias control unit and a phase difference. FIG. 5 is a diagram explaining a configuration example of the bias control unit.

It will be explained about a configuration example of the PLL circuit 200. In this case, the PLL circuit 200 can adjust a phase finely than a predetermined minimum amount of a delay amount that is added by each of the delay elements 120 provided inside the DLL circuit 100. Specifically, it is preferable that the PLL circuit 200 can adjust the phase of an input signal finely than the predetermined minimum amount of the delay amount that is added by each of the delay elements 120 and can transmit an adjustment signal obtained by finely adjusting the phase of the input signal to the DLL circuit 100. For this reason, the following explanation is strictly a configuration example of the PLL circuit 200. The configuration of the PLL circuit 200 is not limited to an example to be described below.

Hereinafter, the PLL circuit 200 uses an input signal as input, and uses a difference between a voltage value generated from the phase difference output from a phase frequency detector 210 of the PLL circuit 200 and a reference voltage value controlled by a bias control unit 260 as a control voltage. It is explained about the PLL circuit 200 that outputs an adjustment signal obtained by adjusting an input signal by using a phase difference specified by the reference voltage value from a voltage-controlled oscillator 250 as an example.

As illustrated in FIG. 1, the PLL circuit 200 is connected to the phase detector 130 of the DLL circuit 100. Moreover, the PLL circuit 200 outputs an adjustment signal. Specifically, the PLL circuit 200 adjusts the phase of an input signal to obtain an adjustment signal, and outputs the adjustment signal to the phase detector 130. In this case, an "input signal" is the same as the "input signal" that is input into the voltage-controlled delay line 110 of the DLL circuit 100.

Figure 2:
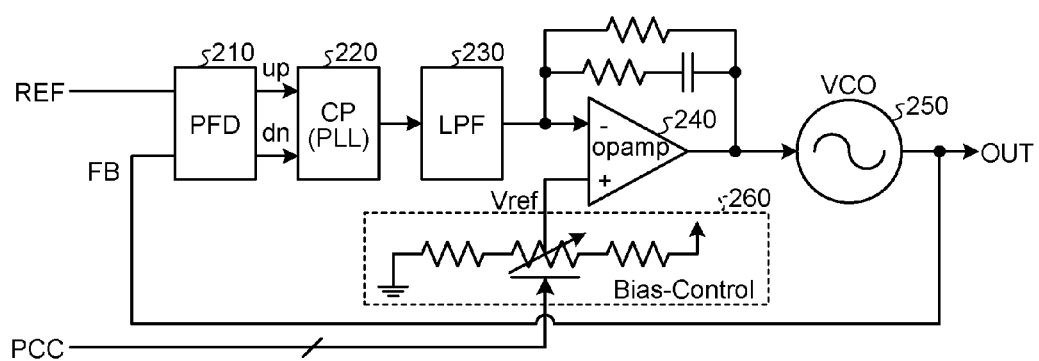
FIG. 2 is a diagram explaining a configuration example of a PLL circuit according to the first embodiment.

As illustrated in FIG. 2, the PLL circuit 200 includes the phase frequency detector ("PFD") 210, a charge pump (PLL) 220, and a low pass filter ("LPF") 230. Furthermore, the PLL circuit 200 includes an operational amplifier ("opamp") 240, the voltage-controlled oscillator ("VCO") 250, and the bias control unit ("Bias-Control") 260.

The phase frequency detector 210 is connected to the charge pump (PLL) 220 and the voltage-controlled oscillator 250. Moreover, the phase frequency detector 210 compares the phases of two signals.

Specifically, the phase frequency detector 210 receives an input signal from the outside of the PLL circuit 200 in which the phase frequency detector 210 is provided. Moreover, the phase frequency detector 210 receives an adjustment signal that is fed back from the voltage-controlled oscillator 250.

Then, the phase frequency detector 210 compares the phase of the input signal and the phase of the adjustment signal. Then, the phase frequency detector 210 transmits a comparison result (phase difference) to the charge pump (PLL) 220.

As a specific example, when the phase of the input signal advances in comparison with the adjustment signal on the basis of the difference between the phases of two signals, the phase frequency detector 210 transmits the phase difference to the charge pump (PLL) 220 as an up signal pulse. On the other hand, when the phase of the input signal delays in comparison with the adjustment signal, the phase frequency detector 210 transmits the phase difference to the charge pump (PLL) 220 as a down signal pulse.

The charge pump (PLL) 220 is connected to the phase frequency detector 210 and a low pass filter 230. Hereinafter, it is explained only about a point that the charge pump (PLL) 220 is different from the charge pump (DLL) 140.

When the comparison result is transmitted from the phase frequency detector 210, the charge pump (PLL) 220 transmits an electric current according to the comparison result to the low pass filter 230. Specifically, the charge pump (PLL) 220 converts the phase difference transmitted from the phase frequency detector 210 into an electric current. Then, the charge pump (PLL) 220 transmits the electric current to the low pass filter 230. In this case, a generalized characteristic accomplished in a relationship between the phase difference of two signals compared by the phase frequency detector 210 and the output voltage of the electric current transmitted from the charge pump (PLL) 220 is illustrated in FIG. 3.

In FIG. 3, the thing that a phase difference is from "2π" to "−2π" is that a phase deviates by one period if a phase advances (or delays) by "2π". The reason is that the absolute value of a phase difference is not larger than "2π". Similarly, the output voltage of the electric current transmitted from the charge pump (PLL) 220 is a value within a range from "Vl" to "Vh".

The low pass filter 230 is connected to the charge pump (PLL) 220 and the operational amplifier 240. Moreover, when the electric current is transmitted from the charge pump (PLL) 220, the low pass filter 230 attenuates a frequency signal higher than a specific threshold value from the electric current to block the frequency signal. Then, the low pass filter 230 allows the passage of only a low-pass frequency of the electric current and transmits the low-pass frequency to the operational amplifier 240.

The operational amplifier 240 is connected to the low pass filter 230, the bias control unit 260, and the voltage-controlled oscillator 250. Moreover, the operational amplifier 240 has two inputs ("+" and "−"). In this case, the "+" input (non-inverting input) of the operational amplifier 240 is connected to the bias control unit 260 and the "−" input (inverting input) of the operational amplifier 240 is connected to the low pass filter 230. The two inputs have the supplied voltage. Moreover, the operational amplifier 240 has one output. A voltage is output from the output and is transmitted to the voltage-controlled oscillator 250.

Moreover, negative feedback is formed from the one output of the operational amplifier 240 to the "−" input of the operational amplifier 240. Because negative feedback is formed in the operational amplifier 240, the output voltage of "+" input and the output voltage of "−" input are always identical to each other (a voltage difference is zero) in accordance with the effect the negative feedback.

The "−" input of the operational amplifier 240 is connected to the low pass filter 230 and takes an output voltage illustrated in FIG. 3. In this case, because the "−" input of the operational amplifier 240 is an inverting input, a voltage (Vref) obtained by inverting the output voltage illustrated in FIG. 3 is taken from the "+" input of the operational amplifier 240 as illustrated in FIG. 4.

In this case, when voltages supplied to two inputs have a difference even if only slightly in the operational amplifier 240, the difference is reflected on the output voltage of the operational amplifier 240. However, the output voltage is immediately fed back to the "−" input to function in such a manner that the voltage difference of two inputs disappears.

The voltage-controlled oscillator 250 is connected to the operational amplifier 240 and the phase frequency detector 210. Moreover, the voltage-controlled oscillator 250 is an oscillator that controls an oscillating frequency by using a voltage, and oscillates an adjustment signal. Specifically, the voltage-controlled oscillator 250 transmits a signal by using the voltage output from the operational amplifier 240. Then, the voltage-controlled oscillator 250 transmits the adjustment signal to the phase frequency detector 210 and also transmits the adjustment signal to the DLL circuit 100 (the phase detector 130). In this case, a signal oscillated by the voltage-controlled oscillator 250 by using the voltage output from the operational amplifier 240 becomes an adjustment signal.

The bias control unit 260 is connected to the operational amplifier 240. Specifically, the bias control unit 260 applies a voltage to the "+" input of the operational amplifier 240. For example, the bias control unit 260 uses a voltage value, which is specified by a control signal (PCC (Phase Controlled Code)) designated by a user who uses the LSI, as a reference voltage value.

For example, DAC (Digital-Analog-Converter) can be applied as the bias control unit 260. The DAC method includes various configurations such as a resistor ladder DAC, a resistor string DAC, or a weight-resistor DAC in accordance with its configuration method. Hereinafter, it is explained about a control (three-bit control in an example illustrated in FIG. 5) performed by a resistor string DAC with reference to FIG. 5.

In this case, it is explained about how the bias control unit 260 decides the voltage (Vref) applied to the "+" input of the operational amplifier 240 by a control signal by using the configuration of the bias control unit 260 illustrated in FIG. 5 as an example. For example, in an example illustrated in FIG. 5, the bias control unit 260 receives a control signal as a 3-bit signal. In the example illustrated in FIG. 5, for example, when a control signal is "101", the bias control unit 260 sets the switch of "MSB" to "ON", the switch of "BIT" to "OFF", and the switch of "LSB" to "ON". In this way, the bias control unit 260 controls a voltage to be applied to the "+" input of the operational amplifier by using an n-bit control signal.

When the bias control unit 260 changes a voltage to be applied to the "+" input of the operational amplifier 240, the operational amplifier 240 is activated to remove the voltage difference. As a result, the voltage applied to the "−" input of the operational amplifier 240 is changed to the voltage of the "+" input of the operational amplifier 240. In other words, when the bias control unit 260 changes a voltage to be applied to the "+" input of the operational amplifier 240, the phase difference of the input signal is changed to a phase difference corresponding to the voltage as illustrated in FIG. 5.

In other words, when the voltage value (vertical axis) of the bias control unit 260 is changed, it leads to change a phase difference (horizontal axis) between the input signal and the adjustment signal. For this reason, the fineness of a step value of a voltage value becomes the resolving power of a phase. For example, when a control is performed by using a 8-bit control signal (external signal), a voltage value is divided into 256. In this case, a phase resolution can be simply set by deciding the number of resistance divisions from the desired phase resolution.

Process by LSI of First Embodiment

Next, it will be explained about an example of a process performed by the LSI according to the first embodiment with reference to FIGS. 6 and 7. First, it is explained about an example of a process performed by the DLL circuit 100 with reference to FIG. 6, and then it is explained about an example of a process performed by the PLL circuit 200. FIG. 6 is a flowchart explaining an example of a process that is performed by the DLL circuit according to the first embodiment. FIG. 7 is a flowchart explaining an example of a process that is performed by the PLL circuit according to the first embodiment.

First, it will be explained about an example of a process that is performed by the DLL circuit 100 with reference to FIG. 6. As illustrated in FIG. 6, in the voltage-controlled delay line 110 of the DLL circuit 100, when receiving an input signal (Step S101: YES), each of the delay elements 120 adds a delay amount to the phase of the input signal (Step S102). Specifically, each of the delay elements 120 gives a delay amount that is uniquely decided to the input signal on the basis of the voltage of the capacitor 150. Moreover, each of the delay elements 120 outputs a delay signal for each of the delay elements 120 to the outside of the DLL circuit 100 (Step S103).

Then, the phase detector 130 compares the phases of two signals (Step S104). Specifically, the phase detector 130 compares the phase of a delay signal delayed by all the delay elements 120 of the voltage-controlled delay line 110 and the phase of an adjustment signal output from the PLL circuit 200. Then, the phase detector 130 transmits a comparison result (Step S105). For example, the phase detector 130 transmits a phase difference to the charge pump (DLL) 140 as the comparison result.

Then, the charge pump (DLL) 140 converts the phase difference into an electric current to charge or discharge the capacitor 150 (Step S106).

Next, it will be explained about an example of a process that is performed by the PLL circuit with reference to FIG. 7. As illustrated in FIG. 7, when there is an input signal (Step S201: YES), the PLL circuit 200 adjusts the phase of the input signal finely than a predetermined minimum amount of a delay amount that is added by each of the delay elements 120 (Step S202), and transmits an adjustment signal obtained by finely adjusting the phase to the DLL circuit 100 (Step S203).

Effect of First Embodiment

As described above, according to the first embodiment, there is provided the PLL circuit 200 that outputs an adjustment signal that is obtained by adjusting the phase of an input signal finely than a predetermined minimum amount of a delay amount that is added by each of the delay elements 120. Moreover, according to the first embodiment, when receiving an input signal, the DLL circuit 100 adds a delay amount to the phase of the input signal by using each of the delay elements 120 and outputs a delay signal for each of the delay elements 120. Moreover, according to the first embodiment, the DLL circuit 100 compares a delay signal delayed by all the delay elements 120 of the voltage-controlled delay line 110 and an adjustment signal output from the PLL circuit 200 to obtain a phase difference. Moreover, according to the first embodiment, the DLL circuit 100 inputs a value, by which the delay signal to be compared by the phase detector 130 is synchronized with the adjustment signal output from the PLL circuit 200 and which is a control voltage value generated from the phase difference output from the phase detector 130, into each of the plurality of delay elements 120 of the delay line. As a result, according to the first embodiment, the phase of an output signal can be controlled in fine detail. Moreover, according to the first embodiment, it leads to expand a transmission margin and thus high speed can be realized.

Specifically, each of the delay elements 120 can control a delay amount within a predetermined range. However, there is a minimum delay amount. For this reason, in a conventional technique, the limit of phase control is the unit of several dozen psec. In this case, as far as an input signal is delayed by using a delay element, a minimum delay amount is a delay amount having the minimum value that is given to the input signal. For this reason, the delay amount of the delay element cannot be a delay amount that is not more than the minimum delay amount.

Figure 8:
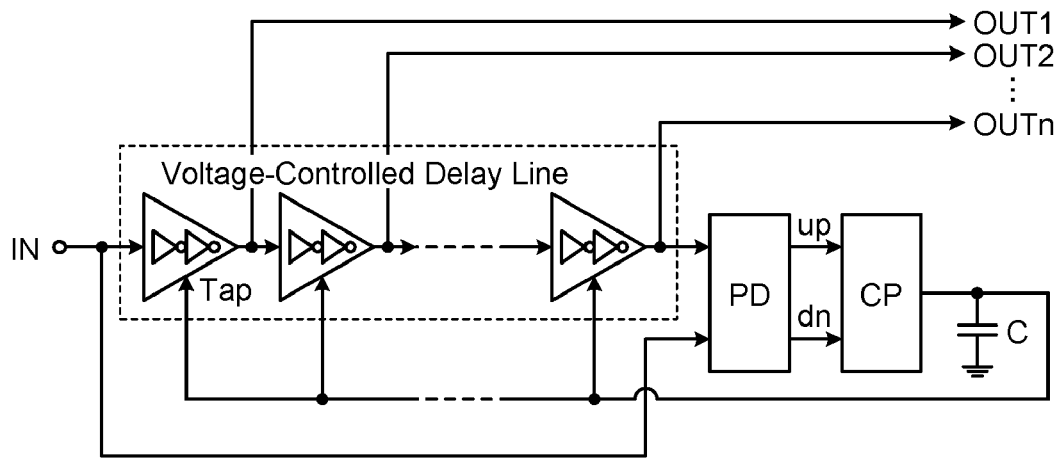
FIG. 8 is a diagram explaining an effect of LSI according to the first embodiment.

Compared with the conventional DLL circuit as illustrated in FIG. 8, the disclosed LSI includes the PLL circuit 200 that outputs an adjustment signal obtained by adjusting the phase of an input signal finely than a predetermined minimum amount of a delay amount that is added by each of the delay elements 120. The PLL circuit 200 creates an adjustment signal obtained by finely adjusting the phase of an input signal and provides the adjustment signal to the phase detector 130 of the DLL circuit 100. Then, the phase detector 130 of the DLL circuit 100 synchronizes the adjustment signal with the input signal (delay signal) delayed by the voltage-controlled delay line 110. As a result, the disclosed LSI can control the phase of an output signal in the unit of a few psec. FIG. 8 is a diagram explaining an effect of the LSI according to the first embodiment.

Figure 9:
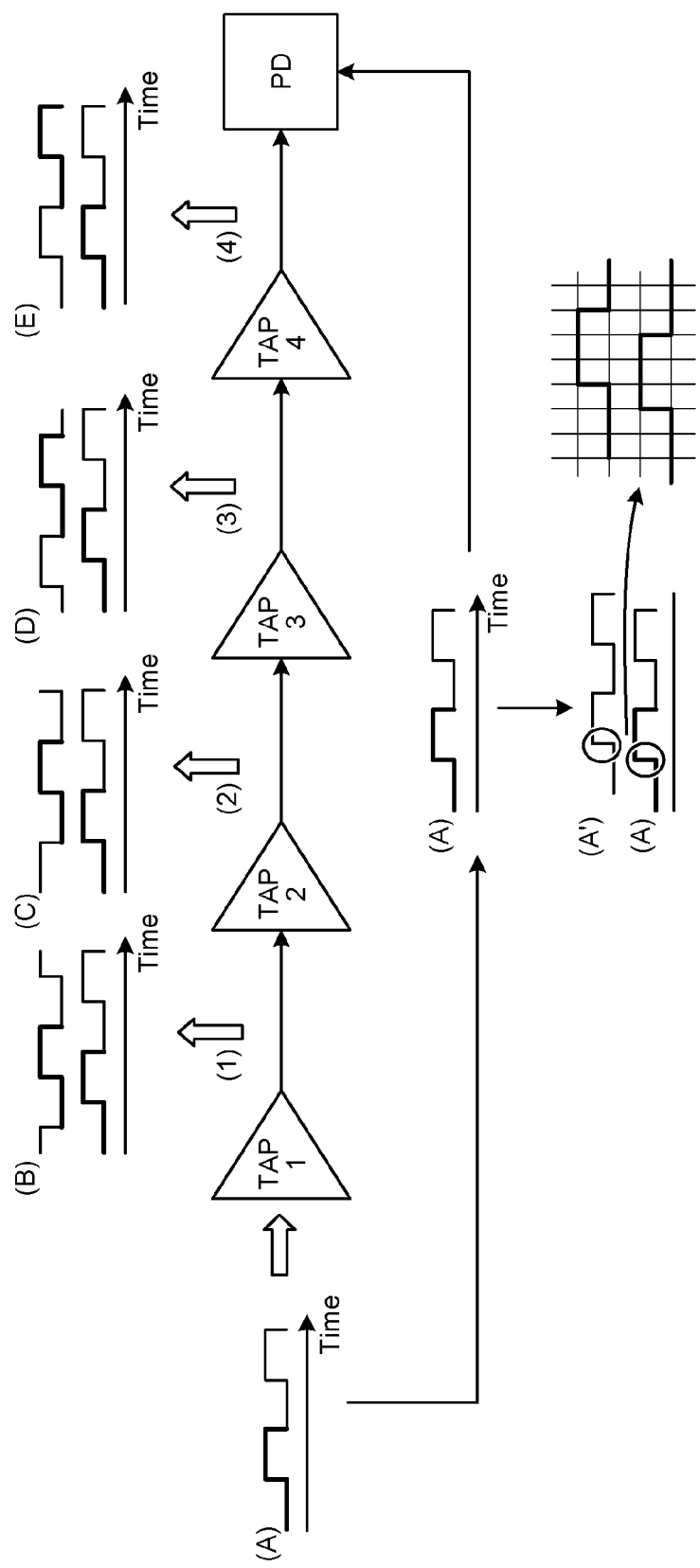
FIG. 9 is a diagram explaining an effect of LSI according to the first embodiment.

In other words, as illustrated in FIG. 9, when an input signal illustrated in (A) of FIG. 9 is input, the DLL circuit 100 adds a delay amount to the input signal. Then, as illustrated in (1) to (4) of FIG. 9, in the DLL circuit 100, delay signals ((B) to (E) of FIG. 9) obtained by adding a delay amount are output from the delay elements 120 (referred to as "Tap" in FIG. 9). FIG. 9 is a diagram explaining an effect of the LSI according to the first embodiment.

In this case, the DLL circuit 100 controls a delay amount in such a manner that the input signal illustrated in (A) of FIG. 9 and the delay signal illustrated in (E) of FIG. 9 are synchronized by the delay of one period.

According to the disclosed LSI, a delay amount is not controlled in such a manner that the input signal itself illustrated in (A) of FIG. 9 and the delay signal illustrated in (E) of FIG. 9 are synchronized, but a delay amount is controlled in such a manner that the phase of the input signal illustrated in (A) of FIG. 9 is finely adjusted and the input signal is synchronized with the adjustment signal. As a result, the phase of an output signal can be shifted by an amount by which the input signal is finely adjusted, and thus the phase of the output signal can be controlled in fine detail.

In other words, the disclosed LSI finely adjusts the phase of the input signal illustrated in (A) of FIG. 9 to be an adjustment signal illustrated in (A') of FIG. 9. Then, the LSI controls a delay amount in such a manner that the delay signal illustrated in (E) of FIG. 9 is synchronized with the adjustment signal illustrated in (A') of FIG. 9. As a result, the phase of each delay signal that is output at (1) to (4) of FIG. 9 is shifted by a fine amount by which the input signal is adjusted to the adjustment signal illustrated in (A') of FIG. 9, compared with the phase of each delay signal illustrated in (B) to (E) illustrated in FIG. 9. As a result, the phase of an output signal can be finely controlled.

According to the disclosed LSI, because the bias control unit 260 uses a voltage value specified by a control signal designated by a user who uses the LSI as a reference voltage value, design flexibility of a user can be improved by controlling a phase resolution by using a control signal.

[b] Second Embodiment

In the first embodiment, it has not been considered that a load given by the phase detector 130 has an influence on a delay signal output from the final-stage delay element 120. However, the present invention is not limited to this. Specifically, it may be considered that a load is given by the phase detector 130 to a delay signal output from the final-stage delay element 120.

In other words, the phase detector 130 gives a predetermined load to a delay signal that is output from the final-stage delay element 120. Moreover, a load provided from the phase detector 130 is not given to a delay signal that is output from each of the delay elements 120 other than the final-stage delay element 120. For this reason, a phase difference between a delay signal output from the final-stage delay element 120 and a delay signal output from the delay element 120 that is located right before the final stage is not the same as a phase difference between delay signals output from the two continuing delay elements 120 excepting the final stage.

In the first embodiment, it is not particularly considered about the difference between the phase differences. However, the present invention is not limited to this. The phase differences may be the same.

Figure 10:
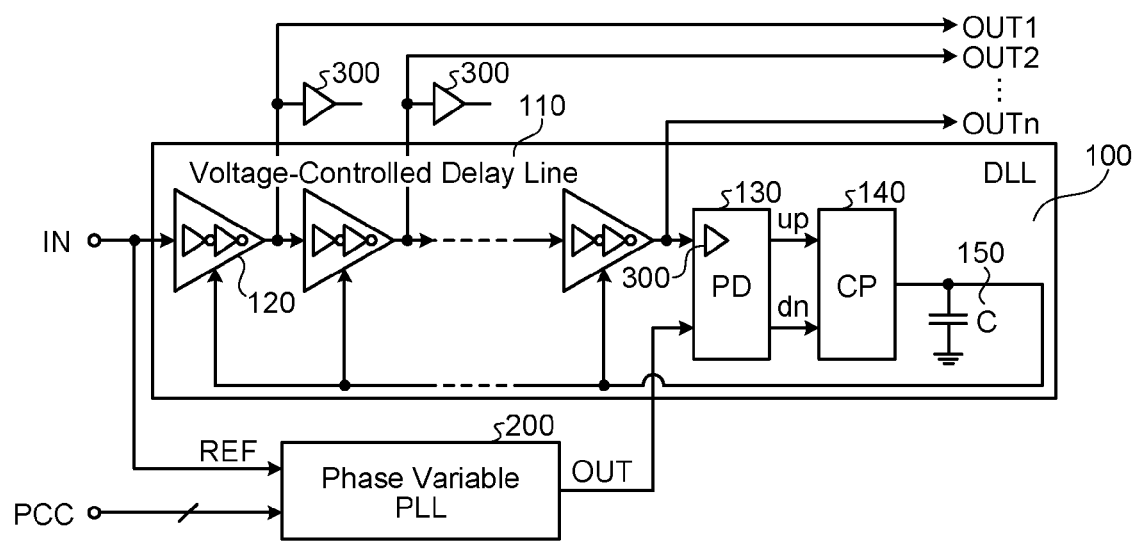
FIG. 10 is a diagram explaining a configuration example of LSI according to a second embodiment.

Specifically, as illustrated in FIG. 10, the voltage-controlled delay line 110 includes elements 300 that respectively give the same load as a predetermined load given to a delay signal by the phase detector 130 to delay signals output from the delay elements 120. Specifically, the voltage-controlled delay line 110 gives the load to delay signals output from the delay elements 120 other than the delay element 120 that supplies a delay signal to be compared by the phase detector 130 to the phase detector 130. FIG. 10 is a diagram explaining a configuration example of LSI according to a second embodiment.

As a result, the LSI according to the second embodiment, phase differences between output signals can be uniformed. For example, the same element 300 as the element 300 provided inside the phase detector 130 is inserted between the delay element 120 and the delay element 120. As a result, loads given to output signals output from the delay elements 120 can be uniformed, and thus phase differences between output signals can be uniformed.

[c] Third Embodiment

In the first and second embodiments, it has been explained about the case where the phase detector 130 compares phases by using an adjustment signal that is obtained by adjusting the phase of an input signal. However, the present invention is not limited to this. The phase detector 130 may compare phases by using a delay signal that is obtained by adjusting a phase. Hereinafter, it will be explained about the case where the phase detector 130 compares phases by using a delay signal that is obtained by adjusting a phase. In this case, their descriptions are omitted about parts common with the above embodiments.

Brief of LSI Configuration by Third Embodiment

Figure 11:
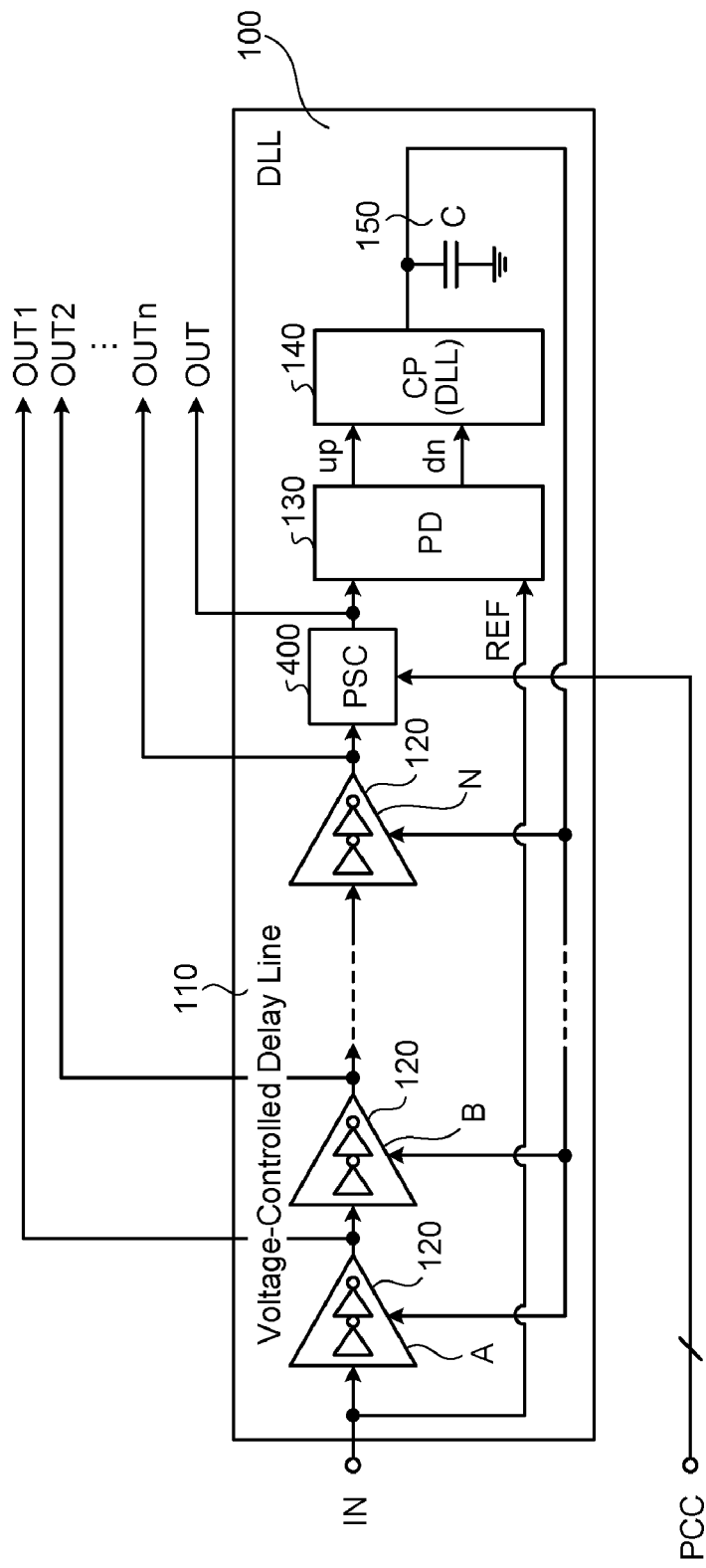
FIG. 11 is a diagram explaining a configuration example of LSI according to a third embodiment.

It will be simply explained about the brief of the configuration of LSI according to a third embodiment with reference to FIG. 11. First, it is simply explained about the brief of the LSI according to the third embodiment with reference to FIG. 11, and then it is explained about the configuration of the LSI according to the third embodiment. FIG. 11 is a diagram explaining a configuration example of the LSI according to the third embodiment.

As illustrated in FIG. 11, the LSI according to the third embodiment includes the DLL circuit 100. Furthermore, the DLL circuit 100 includes a phase adjustment circuit 400. The phase adjustment circuit 400 is connected to the final-stage delay element 120 of the delay elements 120 provided in the DLL circuit 100 and the phase detector 130.

In the LSI according to the third embodiment, when an input signal is input into the DLL circuit 100, the voltage-controlled delay line 110 sends a delay signal delayed by all the delay elements 120 to the phase adjustment circuit 400. Then, the phase adjustment circuit 400 transmits an adjustment delay signal obtained by adjusting the phase of the received delay signal to the phase detector 130.

In the LSI according to the third embodiment, the DLL circuit 100 controls a delay amount by using an adjustment delay signal instead of a delay signal delayed by all the delay elements of the voltage-controlled delay line 110. In other words, the DLL circuit 100 controls a delay amount that is added by each of the delay elements 120 in such a manner that the adjustment delay signal and the input signal are synchronized by the delay of one period. As a result, the LSI according to the third embodiment can finely control the phase of an output signal.

Configuration of LSI by Third Embodiment

Next, it will be explained about the configuration of the LSI according to the third embodiment with reference to FIGS. 11 and 12. First, among the configurations of the LSI according to the third embodiment, it is explained about a configuration example of the DLL circuit 100 according to the third embodiment, and then it is explained about an example of the phase adjustment circuit 400 provided inside the DLL circuit 100 according to the third embodiment.

DLL Circuit by Third Embodiment

It will be explained about the DLL circuit 100 according to the third embodiment. As illustrated in FIG. 11, the LSI according to the third embodiment includes the voltage-controlled delay line 110, the phase detector 130, the charge pump (DLL) 140, and the capacitor 150 in the DLL circuit 100. The LSI further includes the phase adjustment circuit 400. In this case, because the explanations about the voltage-controlled delay line 110, the charge pump (DLL) 140, and the capacitor 150 are similar to the explanations about the DLL circuit 100 according to the first embodiment, their descriptions are omitted.

The voltage-controlled delay line 110 is connected to the phase adjustment circuit 400. Specifically, the voltage-controlled delay line 110 is connected to the phase adjustment circuit 400 via the final-stage delay element 120 of the plurality of delay elements 120 included in the voltage-controlled delay line 110. In an example illustrated in FIG. 11, the voltage-controlled delay line 110 is connected to the phase adjustment circuit 400 via a delay element "N". Moreover, the voltage-controlled delay line 110 receives an input signal, and sends a delay signal delayed by all the delay elements of the voltage-controlled delay line 110 to the phase adjustment circuit 400. In the example illustrated in FIG. 11, the delay element "N" of the voltage-controlled delay line 110 sends a delay signal to the phase adjustment circuit 400. Furthermore, as illustrated by "OUTn" of FIG. 11, the delay element "N" sends the delay signal to the outside of the DLL circuit 100.

The phase detector 130 is connected to the phase adjustment circuit 400, and compares the phases of two signals. Specifically, the phase detector 130 receives an adjustment delay signal from the phase adjustment circuit 400. Furthermore, as illustrated by "REF" of FIG. 11, the phase detector 130 receives an input signal. Then, the phase detector 130 compares the phase of the adjustment delay signal received from the phase adjustment circuit 400 and the phase of the input signal, and transmits a comparison result (phase difference) to the charge pump (DLL) 140. In this case, the input signal received by the phase detector 130 is the same as the input signal received by the voltage-controlled delay line 110.

Phase Adjustment Circuit by Third Embodiment

It will be explained about the phase adjustment circuit 400. As illustrated in FIG. 11, the phase adjustment circuit 400 is connected to the voltage-controlled delay line 110 and the phase detector 130. Moreover, the phase adjustment circuit 400 receives a delay signal delayed by all the delay elements of the voltage-controlled delay line 110, adjusts the phase of the received delay signal, and transmits an adjustment delay signal to the phase detector 130.

In this case, it is preferable that the phase adjustment circuit 400 can switch the phase by a control signal (for example, PCC). For example, the phase adjustment circuit 400 corresponds to a selector circuit that is below explained. Hereinafter, it will be explained about a configuration example of the phase adjustment circuit 400 when using a selector circuit with reference to FIG. 12. FIG. 12 is a diagram explaining a configuration example of the phase adjustment circuit when using a selector circuit according to the third embodiment. In this case, the PLL circuit 200 that is explained in the first and second embodiments may be used as the phase adjustment circuit 400.

Figure 12:
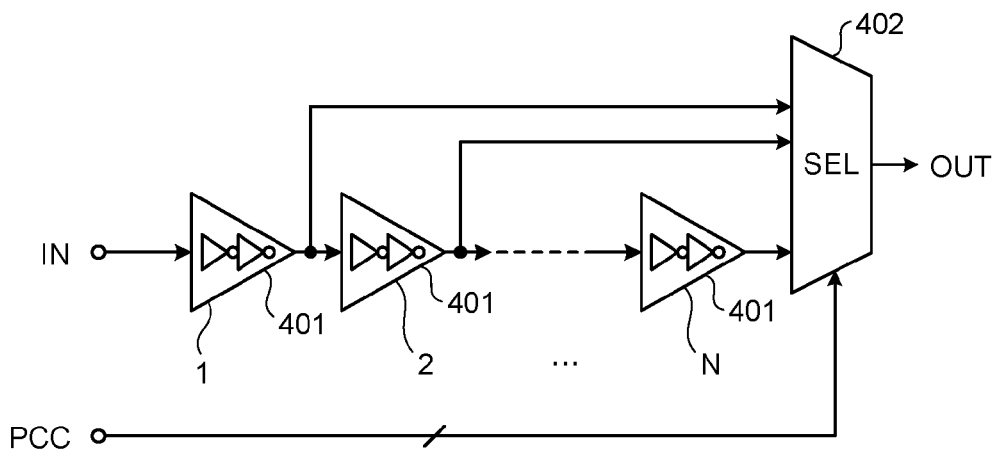
FIG. 12 is a diagram explaining a configuration example of a phase adjustment circuit when using a selector circuit according to the third embodiment.

As illustrated in FIG. 12, the phase adjustment circuit 400 includes a plurality of delay elements 401 and a selector circuit 402. In this case, the delay elements 401 are serially coupled, and each of the delay elements 401 is connected to the selector circuit 402. Each of the delay elements 401 has the same performance as that of the delay element 120. In the phase adjustment circuit 400, when receiving a delay signal from the voltage-controlled delay line 110, each of the delay elements 401 adds a delay amount to the phase of the delay signal in order from the first-stage delay element 401 of the plurality of delay elements 401 that is serially coupled, and sends a delay signal for each of the delay elements 401 to the selector circuit 402.

In an example illustrated in FIG. 12, in the phase adjustment circuit 400, the delay element "1" adds a delay amount to the delay signal received from the voltage-controlled delay line 110, and sends the added delay signal to the delay element "2" and the selector circuit 402. After that, the delay element "2" adds a delay amount to the delay signal received from the delay element "1" and sends the added delay signal to the delay element "3" and the selector circuit 402.

The selector circuit 402 is connected to the delay elements 401 and is further connected to the phase detector 130 located in the DLL circuit 100. The selector circuit 402 receives a delay signal from each of the delay elements 401 and further receives a control signal from the outside of the DLL circuit 100. In this case, the selector circuit 402 sends a delay signal designated by the control signal among delay signals received from the delay elements 401 to the phase detector 130 as an adjustment delay signal.

After that, the DLL circuit 100 changes a delay amount that is added by the voltage-controlled delay line 110 by a phase difference between the adjustment delay signal output from the selector circuit 402 and the delay signal received by the selector circuit 402. In this case, the difference is equally distributed to each of the delay elements 120. A delay amount that is added by each of the delay elements 120 is changed by a value that is obtained by dividing the difference by the number of the delay elements 120.

Figure 13:
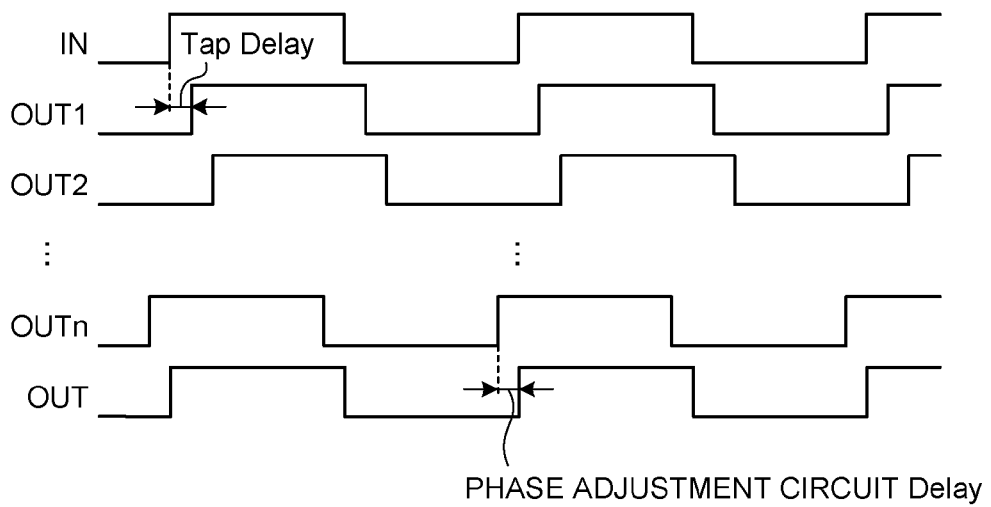
FIG. 13 is a diagram explaining two signals that are synchronized by the delay of one period according to the third embodiment.

In the DLL circuit 100 according to the first and second embodiments, the phase of an input signal illustrated by "IN" of FIG. 13 is adjusted and controlled in such a manner that the delay signal output from the final-stage delay element 120 illustrated by "OUTn" of FIG. 13 and the adjustment signal are synchronized by the delay of one period. FIG. 13 is a diagram explaining two signals that are synchronized by the delay of one period according to the third embodiment. Moreover, "Tap Delay" illustrated in FIG. 13 indicates a delay amount given by the delay element 120.

On the other hand, according to the third embodiment, the phase adjustment circuit 400 adjusts a delay signal output from the final-stage delay element 120 illustrated by "OUTn" of FIG. 13 and outputs an adjustment delay signal "OUT". Then, the DLL circuit 100 performs a control in such a manner that the input signal illustrated by "IN" of FIG. 13 and the adjustment delay signal illustrated by "OUT" of FIG. 13 are synchronized by the delay of one period. In this case, "phase adjustment circuit Delay" illustrated in FIG. 13 indicates a delay amount given by the phase adjustment circuit 400.

Effect of Third Embodiment

As described above, according to the third embodiment, the phase adjustment circuit 400 adjusts and outputs the phase of a delay signal delayed by all the delay elements, and the phase detector 130 compares the phase of the adjustment delay signal output from the phase adjustment circuit 400 and the phase of the input signal to obtain a phase difference. As a result, according to the third embodiment, the phase of an output signal can be finely controlled.

[d] Fourth Embodiment

Figure 14:
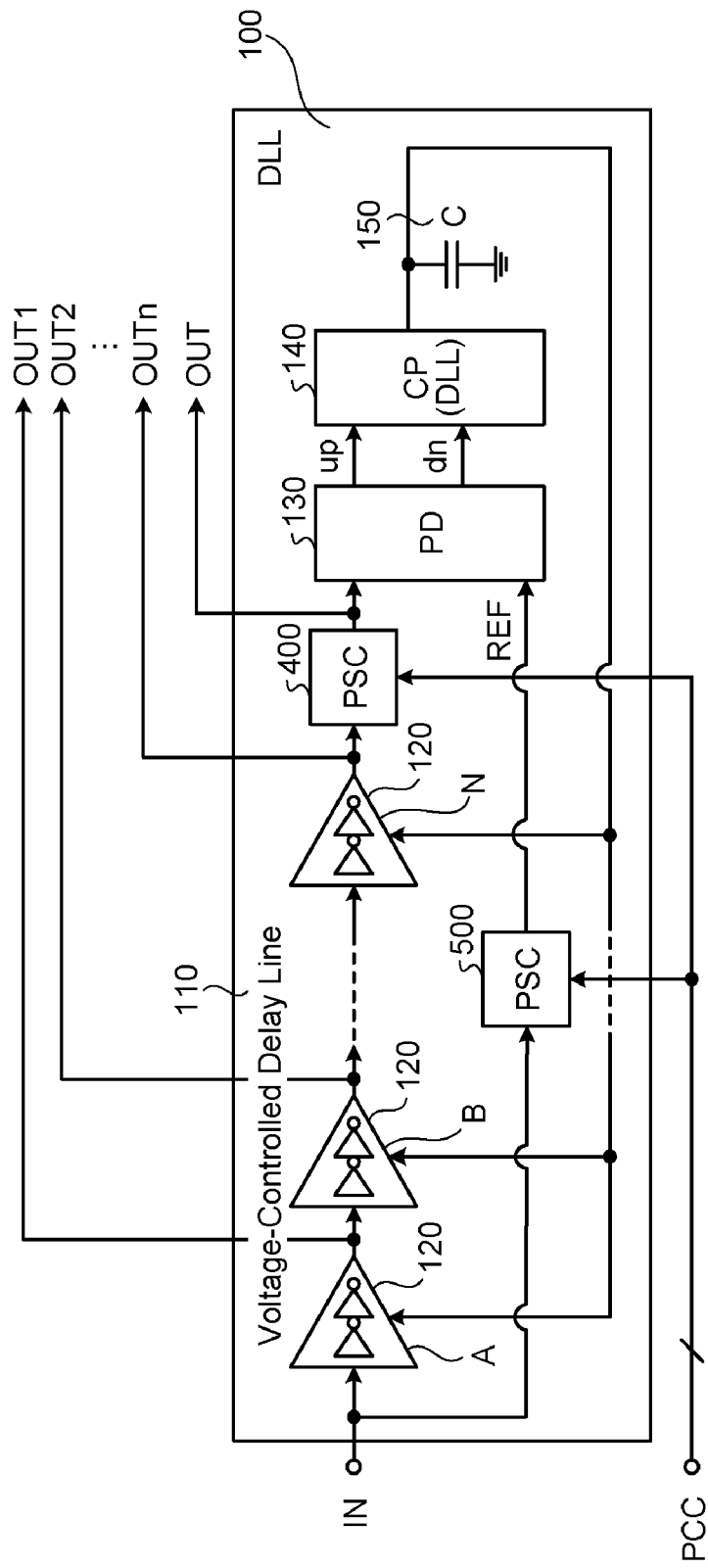
FIG. 14 is a diagram explaining a configuration example of LSI according to a fourth embodiment.

In the first to third embodiments, it has been explained about the case where the phase of one of an input signal and a delay signal is adjusted. However, the present invention is not limited to this. The phases of both of an input signal and a delay signal may be adjusted. Therefore, according to a fourth embodiment, it will be explained about the case where the phases of both of an input signal and a delay signal are adjusted with reference to FIG. 14. FIG. 14 is a diagram explaining a configuration example of LSI according to the fourth embodiment.

As illustrated in FIG. 14, the LSI according to the fourth embodiment includes the voltage-controlled delay line 110, the phase detector 130, the charge pump (DLL) 140, and the capacitor 150 in the DLL circuit 100. The LSI further includes the phase adjustment circuit 400 and a phase adjustment circuit 500. In this case, because the explanations about the voltage-controlled delay line 110, the charge pump (DLL) 140, and the capacitor 150 are similar to the explanations of the DLL circuit 100 according to the first embodiment, their descriptions are omitted. Moreover, the phase adjustment circuit 400 corresponds to the phase adjustment circuit 400 that is explained in the third embodiment.

The phase adjustment circuit 500 has the same performance as that of the phase adjustment circuit 400, and is connected to the phase detector 130. Moreover, similarly to the PLL circuit 200 according to the first embodiment, the phase adjustment circuit 500 receives an input signal and sends an adjustment signal to the phase detector 130.

One of the phase adjustment circuit 400 and the phase adjustment circuit 500 previously performs setting related to a delay amount by a user in such a manner that delay amounts added by the phase adjustment circuit 400 and the phase adjustment circuit 500 are not the same when receiving the same control signal. In other words, in an example illustrated by FIG. 14, the phase adjustment circuit 400 and the phase adjustment circuit 500 receive the same control signal (PCC illustrated in FIG. 14). When the phase adjustment circuit 400 and the phase adjustment circuit 500 add the same delay amount in response to the reception of the same control signal, two signals compared by the phase detector 130 do not have a phase difference and thus a delay amount that is added by each of the delay elements 120 cannot be controlled.

For this reason, one of the phase adjustment circuit 400 and the phase adjustment circuit 500 performs by a user, for example, setting by which a delay amount (referred to as phase control amount) to be added when the same control signal is received becomes two times (a resolving power is degraded by two times), compared with the other phase adjustment circuit.

The present invention is not limited to a technique for performing setting on only one of the phase adjustment circuit 400 and the phase adjustment circuit 500 by a user. For example, the present invention may perform different settings on the phase adjustment circuit 400 and the phase adjustment circuit 500.

Moreover, the reason that setting must be performed on the phase adjustment circuit is that the phase adjustment circuit 400 and the phase adjustment circuit 500 use the same control signal. For this reason, instead of performing setting on the phase adjustment circuit 400 and the phase adjustment circuit 500, the phase adjustment circuit 400 and the phase adjustment circuit 500 may receive separate control signals.

Effect of Fourth Embodiment

According to the fourth embodiment, the phase adjustment circuit 400 outputs an adjustment delay signal, the phase adjustment circuit 500 outputs an adjustment signal, and the phase detector 130 compares the phases of the adjustment delay signal and the adjustment signal output from the phase adjustment circuit 400 and the phase adjustment circuit 500 to obtain a phase difference. As a result, according to the fourth embodiment, the phase of an output signal can be finely controlled and error fluctuation caused by the phase adjustment circuits can be further cancelled.

It will be further explained about the case where error fluctuation caused by the phase adjustment circuits can be cancelled. A phase adjustment circuit (PLL circuit in the first and second embodiments) has an error factor that is caused by an external environment. In this case, error fluctuation is an error caused by the error factor. For example, when a PLL circuit is used as a phase adjustment circuit, a stationary phase error occurs. In this case, a stationary phase error is an error factor that is caused by the change of an input-output phase difference of the PLL circuit due to an external environment. An external environment corresponds to, for example, temperature or humidity.

As a result, in a technique for adjusting the phase of one of an input signal and a delay signal, one of signals compared by the phase detector 130 has error fluctuation and thus the phase detector 130 outputs a value including error fluctuation as a comparison result (phase difference). After that, the DLL circuit 100 controls a delay amount that is added by each of the delay elements 120 by using the comparison result including error fluctuation.

On the other hand, according to the fourth embodiment, the phase adjustment circuit 400 and the phase adjustment circuit 500 adjust both phases of signals compared by the phase detector 130, and thus the phase detector 130 compares two signals including the same error fluctuation. This reason is that error fluctuation is caused due to an external environment and error fluctuation included in signals compared by the phase detector 130 has the same value. As a result, according to the fourth embodiment, the phase detector 130 can achieve a comparison result that does not include error fluctuation. In other words, according to the fourth embodiment, the phase of an output signal can be finely controlled after cancelling an influence caused by error fluctuation.

[e] Fifth Embodiment

In the third and fourth embodiments, it has been explained about the case where the phase adjustment circuit 400 gives a load to a delay signal output from the final-stage delay element 120. Therefore, in a fifth embodiment, it will be explained about the case where the phase adjustment circuit 400 equally gives a load given to the delay signal output from the final-stage delay element 120 to all the delay elements 120.

In other words, the phase adjustment circuit 400 gives a predetermined load to a delay signal output from the final-stage delay element 120. The load provided from the phase adjustment circuit 400 is not given to delay signals output from the delay elements 120 other than the final-stage delay element 120. For this reason, a phase difference between a delay signal output from the final-stage delay element 120 and a delay signal output from the delay element 120 just before the final-stage delay element is not the same as a phase difference between delay signals output from the two continuing delay elements 120 excepting the final-stage delay element. Hereinafter, it will be explained about the case where phase differences between delay signals output from the delay elements 120 are the same.

Figure 15:
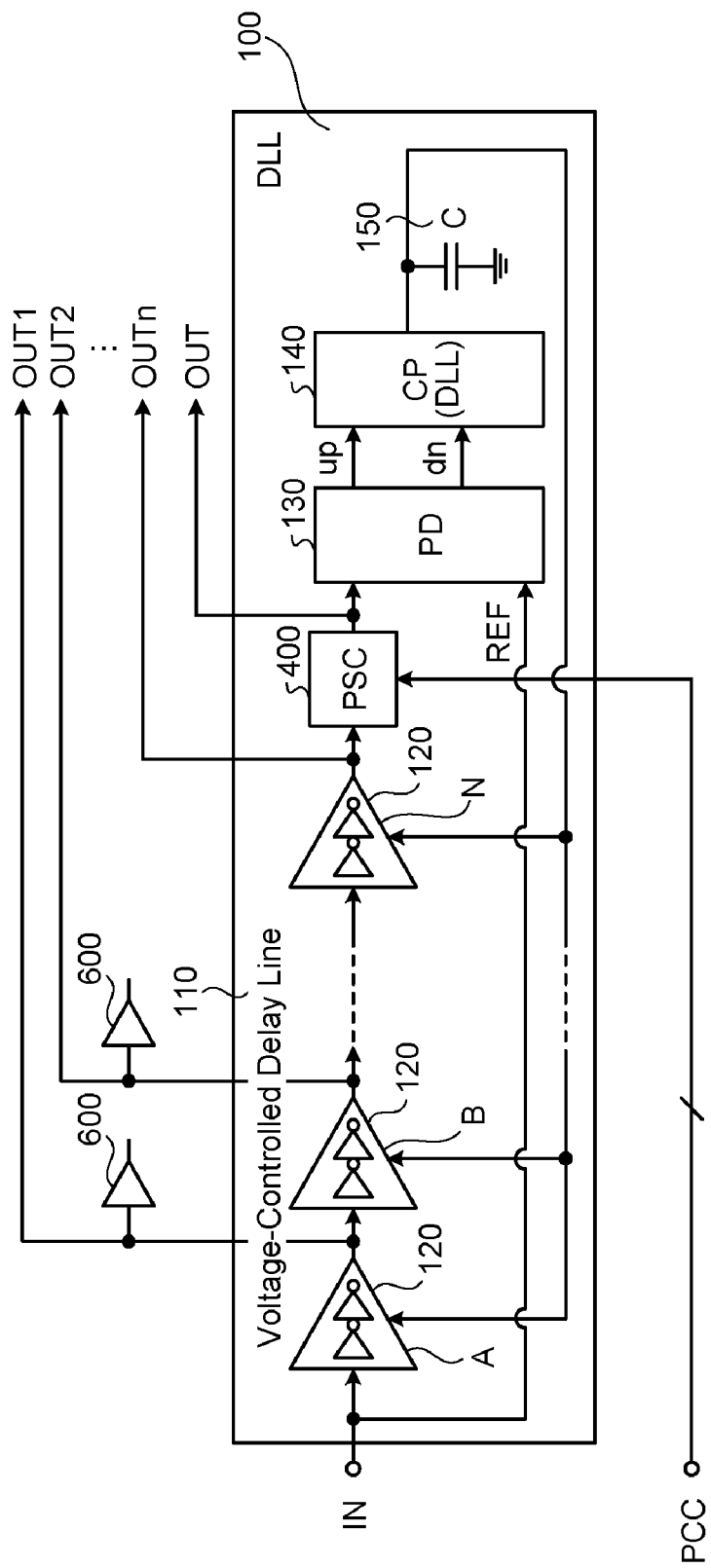
FIG. 15 is a diagram explaining a configuration example of LSI according to a fifth embodiment.

Specifically, as illustrated in FIG. 15, the voltage-controlled delay line 110 further includes elements 600. Each of the elements 600 gives the same load as the predetermined load given to the delay signal by the phase adjustment circuit 400 to a delay signal that is output from each of the delay elements 120. Specifically, the elements 600 give a load to delay signals output from the delay elements 120, other than the delay element 120 that supplies a delay signal adjusted by the phase adjustment circuit 400 to the phase detector 130, among the delay elements 120. FIG. 15 is a diagram explaining a configuration example of LSI according to the fifth embodiment.

As a result, according to the LSI according to the fifth embodiment, loads given to output signals output from the delay elements 120 can be uniformed and thus phase differences between output signals can be uniformed.

[f] Sixth Embodiment

It has been explained about the embodiments of the present invention so far. However, the present invention is not limited to the embodiments described above. The present invention may be realized by another embodiment. Hereinafter, it will be explained about the other embodiment.

Phase Difference Comparison Technique in PLL Circuit

For example, it is particularly not mentioned about a technique for using a sawtooth wave as a phase comparison technique (technique for comparing the phases of two signals by a phase frequency detector) in the PLL circuit. However, a sawtooth wave may be used. Specifically, a phase detector may be a phase detector in which a relationship between an output voltage and a phase difference becomes a sawtooth wave.

In the first embodiment, as illustrated in FIG. 5, it has been explained about the case where the output detector 130 in which a relationship between an output voltage and a phase difference becomes a phase slope of $\pm 2\pi$ is used. Moreover, in the phase detector 130 according to the first embodiment, a relationship between an output voltage and a phase difference indicates a constant output voltage in an area not less than $+2\pi$ and an area not more than $-+2\pi$.

However, the present invention is not limited to a technique in which the phase detector 130 in which a relationship between an output voltage and a phase difference becomes a phase slope of $\pm 2\pi$ is used. For example, in the LSI according to the third embodiment, a phase detector in which a relationship between an output voltage and a phase difference becomes a phase slope of $\pm \pi$ and a relationship between an output voltage and a phase difference becomes the shape of a sawtooth wave may be used. As a result, in the LSI according to the third embodiment, voltage sensitivity in a bias control unit can be ½.

Phase Adjustment Circuit

For example, in the first embodiment, it has been explained about a technique for using the PLL circuit 200 as a circuit that adjusts the phase of an input signal. However, the present invention is not limited to this. The present invention may use the phase adjustment circuit 400 or the phase adjustment circuit 500 that is explained in the third embodiment. For example, instead of the PLL circuit 200, the phase adjustment circuit 400 that uses the selector circuit 402 may be used.

Moreover, although the PLL circuit 200 may be used or the selector circuit 402 may be used as the phase adjustment circuit 400 or the phase adjustment circuit 500, high-frequency-component jitter can be cancelled by using the PLL circuit 200. The jitter indicates time-lag or fluctuation of a signal.

In other words, in the PLL circuit 200, the low pass filter 230 attenuates and blocks a frequency signal higher than a specific threshold value. As a result, even if an input signal to be input into the PLL circuit 200 has high-frequency-component jitter, the signal output from the PLL circuit 200 can have reduced jitter.

The PLL circuit 200 can adjust a phase finely than a predetermined minimum amount of delay amounts that are added by the delay element 120, and can adjust the phase of an output signal finely than the case where the selector circuit 402 is used.

Bias Control Unit

Figure 16:
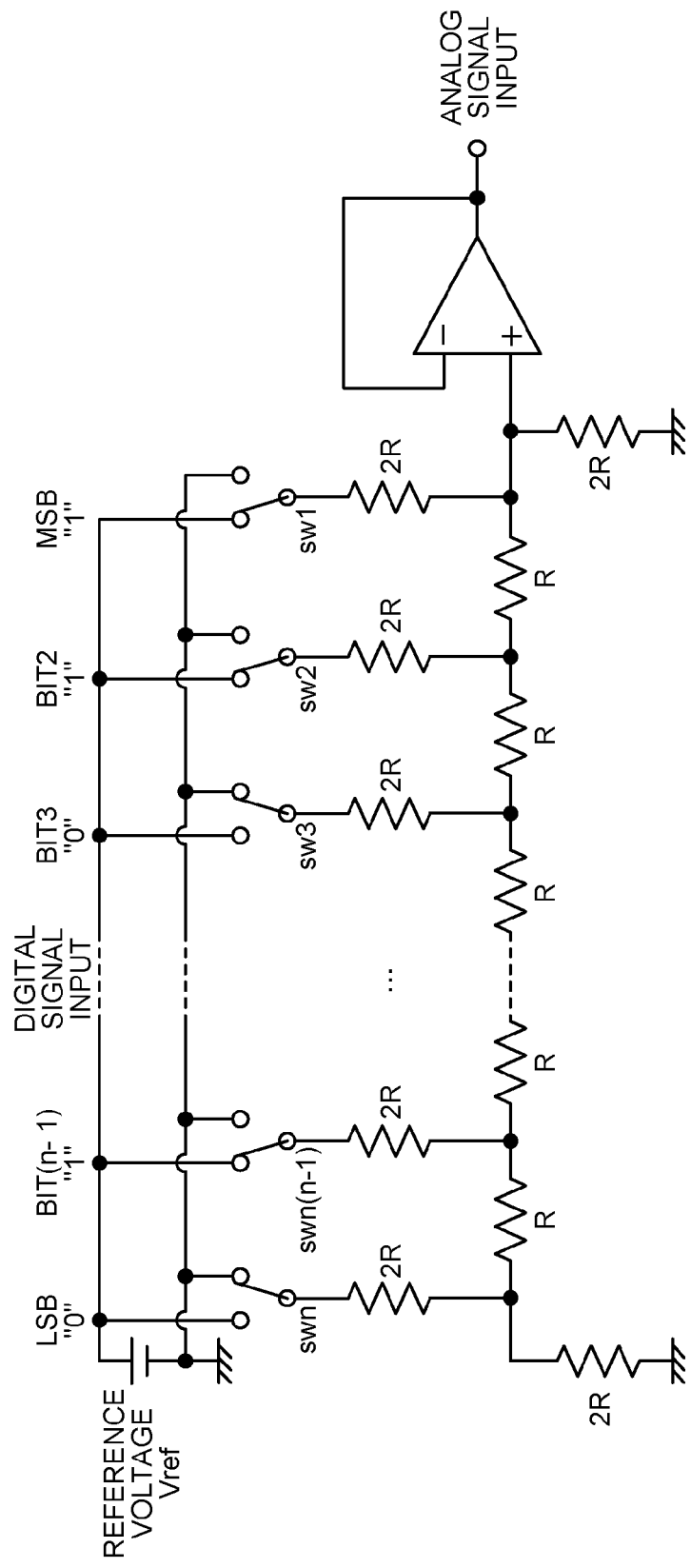
FIG. 16 is a diagram explaining a configuration example of a bias control unit when using a resistor ladder DAC.

For example, in the first embodiment, it has been explained about a resistor string DAC with reference to FIG. 5. Now, it will be further explained about the case where a resistor ladder DAC is used with reference to FIG. 16. FIG. 16 is a diagram explaining the bias control unit 260 when using a resistor ladder DAC.

In an example illustrated by FIG. 16, the bias control unit 260 includes switches that are associated with resistors "2R". When the switch is "ON", the resistor "2R" is connected to a reference voltage Vref. When the switch is "OFF", the resistor "2R" is connected to a ground. Moreover, in the example illustrated by FIG. 16, the bias control unit 260 receives an N-bit signal as a control signal of deciding "ON" or "OFF" of the switch. In the example illustrated by FIG. 16, the bias control unit 260 sets a switch "MSB" to "ON" when the first bit of the signal is "1" and sets a switch "BITS" to "OFF" when the third bit of the signal is "0". As a result, the bias control unit 260 controls a voltage to be applied to the "+" input of the operational amplifier by using the N-bit control signal.

Combination of Embodiments

In the first embodiment, it has been explained about a technique for using a control signal provided from the outside when a delay amount to be given to an input signal is decided by the PLL circuit 200. However, the present invention is not limited to this. For example, a delay amount that is given to an input signal by the PLL circuit 200 may be fixed.

System Configuration

Moreover, processing procedures, control procedures, concrete titles, and information including various types of data and parameters (FIGS. 1, 2, 5, 6, 7, 11, 12, 14, 15), which are described in the document and the drawings, can be arbitrarily changed except that they are specially mentioned.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A phase control device comprising a DLL circuit that adds a delay amount to a phase of a reference signal by using delay elements, wherein the DLL circuit includes a delay line that adds, when receiving the reference signal, a delay amount to the phase of the reference signal by using each of the delay elements and outputs a delay signal for each of the delay elements;

a phase detector that compares a phase of a delay signal delayed by all the delay elements of the delay line and the phase of the reference signal to obtain a phase difference by using an adjusted delay signal being outputted by a phase adjustment circuit or an adjusted reference signal being outputted by the phase adjustment circuit or a combination thereof, the phase adjustment circuit, when receiving the reference signal or the delay signal delayed by all the delay elements of the delay line or a combination thereof, adjusting the phase of the received reference signal or the received delay signal or a combination thereof and outputting the adjusted delay signal or adjusted reference signal or a combination thereof; and a delay element control circuit that inputs a control voltage value into each of the delay elements of the delay line, the control voltage value being a value by which the delay signal to be compared by the phase detector is synchronized with the reference signal to be compared by the phase detector and being generated from the phase difference output from the phase detector.

2. The phase control device according to claim 1, wherein
the phase detector compares the phase of the delay signal
   delayed by all the delay elements of the delay line and a
   phase of the adjusted reference signal output from the
   phase adjustment circuit to obtain a phase difference,
   and
the delay element control circuit inputs a control voltage
   value into each of the delay elements of the delay line,
   the control voltage value being a value by which the
   delay signal to be compared by the phase detector is
   synchronized with the adjusted reference signal output
   from the phase adjustment circuit.

3. The phase control device according to claim 1, wherein
the phase detector compares a phase of the adjusted delay
   signal output from the phase adjustment circuit and the
   phase of the reference signal to obtain a phase difference, and
the delay element control circuit inputs a control voltage
   value into each of the delay elements of the delay line,
   the control voltage value being a value by which the
   adjusted delay signal to be compared by the phase detector is synchronized with the reference signal.

4. The phase control device according to claim 1, wherein
the phase detector compares a phase of the adjusted delay
   signal and the phase of the adjusted reference signal
   output from the phase adjustment circuit to obtain a
   phase difference, and
the delay element control circuit inputs a control voltage
   value into each of the delay elements of the delay line,
   the control voltage value being a value by which the
   adjusted delay signal to be compared by the phase detector is synchronized with the adjusted reference signal
   output from the phase adjustment circuit.

5. The phase control device according to claim 2, wherein
the phase detector gives a predetermined load to a delay
   signal that is output from a final-stage delay element,
   and
the delay line includes elements that respectively give a
   same load as the predetermined load given to the delay
   signal by the phase detector to delay signals output from
   delay elements other than the delay element that supplies the delay signal to be compared by the phase detector to the phase detector, among the delay elements.

6. The phase control device according to claim 3, wherein
the phase adjustment circuit gives a predetermined load to
   a delay signal that is output from a final-stage delay
   element, and
the delay line includes elements that respectively give a
   same load as the predetermined load given to the delay
   signal by the phase adjustment circuit to delay signals
   output from delay elements other than the delay element
   that supplies the delay signal adjusted by the phase
   adjustment circuit to the phase adjustment circuit,
   among the delay elements.

7. The phase control device according to claim 4, wherein
the phase adjustment circuit gives a predetermined load to
   a delay signal that is output from a final-stage delay
   element, and
the delay line includes elements that respectively give a
   same load as the predetermined load given to the delay
   signal by the phase adjustment circuit to delay signals
   output from delay elements other than the delay element
   that supplies the delay signal adjusted by the phase
   adjustment circuit to the phase adjustment circuit,
   among the delay elements.

8. The phase control device according to claim 1, wherein
the phase adjustment circuit is a PLL circuit, and uses the
   reference signal as an input and uses as a control voltage
   a voltage value generated from a phase difference output
   from a phase detector of the phase adjustment circuit and
   a reference voltage value controlled by a bias control
   unit, to output, from a voltage-controlled oscillator, the
   adjusted reference signal that is obtained by adjusting
   the reference signal by using a phase difference specified
   by the reference voltage value.

9. The phase control device according to claim 8, wherein
the bias control unit uses a voltage value specified by a control
signal designated by a user who uses the phase control device
as the reference voltage value.

10. The phase control device according to claim 9, wherein
the phase detector is configured so that a relationship between
an output voltage and a phase difference indicates a sawtooth
wave.

11. A printed board on which a phase control device is
mounted, the phase control device comprising a DLL circuit
that adds a delay amount to a phase of a reference signal by
using delay elements, wherein the DLL circuit includes
a delay line that adds, when receiving the reference signal,
   a delay amount to the phase of the reference signal by
   using each of the delay elements and outputs a delay
   signal for each of the delay elements;
a phase detector that compares a phase of a delay signal
   delayed by all the delay elements of the delay line and
   the phase of the reference signal to obtain a phase difference by using an adjusted delay signal being outputted by a phase adjustment circuit or an adjusted reference signal being outputted by the phase adjustment
   circuit or a combination thereof, the phase adjustment
   circuit, when receiving the reference signal or the delay
   signal delayed by all the delay elements of the delay line
   or a combination thereof, adjusting the phase of the
   received reference signal or the received delay signal or
   a combination thereof and outputting the adjusted delay
   signal or adjusted reference signal or a combination
   thereof; and
a delay element control circuit that inputs a control voltage
   value into each of the delay elements of the delay line,
   the control voltage value being a value by which the
   delay signal to be compared by the phase detector is
   synchronized with the reference signal to be compared
   by the phase detector and being generated from the
   phase difference output from the phase detector.

12. A phase control device comprising:
a DLL circuit that adds a delay amount to a phase of a
   reference signal by using delay elements; and
a PLL circuit that outputs an adjusted reference signal
   obtained by adjusting the phase of the reference signal
   finely than a predetermined minimum amount of the
   delay amounts added by the delay elements,
wherein the DLL circuit includes
a delay line that adds, when receiving the reference signal,
   a delay amount to the phase of the reference signal by
   using each of the delay elements and outputs a delay
   signal for each of the delay elements;
a phase detector that compares a phase of a delay signal
   delayed by all the delay elements of the delay line and a
   phase of the adjusted reference signal output from the
   PLL circuit to obtain a phase difference; and
a delay element control circuit that inputs a control voltage
   value into each of the delay elements of the delay line,
   the control voltage value being a value by which the
   delay signal to be compared by the phase detector is synchronized with the adjusted reference signal output from the PLL circuit and being generated from the phase difference output from the phase detector.

13. The phase control device according to claim 12, wherein the PLL circuit uses the reference signal as an input and uses as a control voltage a voltage value generated from a phase difference output from a phase detector of the PLL circuit and a reference voltage value controlled by a bias control unit, to output, from a voltage-controlled oscillator, the adjusted reference signal that is obtained by adjusting the reference signal by using a phase difference specified by the reference voltage value.

14. The phase control device according to claim 13, wherein the bias control unit uses a voltage value specified by a control signal designated by a user who uses the phase control device as the reference voltage value.

15. The phase control device according to claim 12, wherein
 the phase detector gives a predetermined load to a delay signal that is output from a final-stage delay element, and
 the delay line includes elements that respectively give a same load as the predetermined load given to the delay signal by the phase detector to delay signals output from delay elements other than the delay element that supplies the delay signal to be compared by the phase detector to the phase detector, among the delay elements.

16. The phase control device according to claim 15, wherein the phase detector is configured so that a relationship between an output voltage and a phase difference indicates a sawtooth wave.

* * * * *